(12) United States Patent
Haas et al.

(10) Patent No.: US 9,343,347 B2
(45) Date of Patent: May 17, 2016

(54) PORTABLE ELECTROSTATIC CHUCK CARRIER FOR THIN SUBSTRATES

(71) Applicant: APPLIED MATERIALS, INC., Santa Clara, CA (US)

(72) Inventors: Dieter Haas, San Jose, CA (US); Majeed A. Foad, Sunnyvale, CA (US); Ralf Hofmann, Soquel, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 249 days.

(21) Appl. No.: 14/018,959

(22) Filed: Sep. 5, 2013

(65) Prior Publication Data

US 2014/0071581 A1 Mar. 13, 2014

Related U.S. Application Data

(60) Provisional application No. 61/697,915, filed on Sep. 7, 2012, provisional application No. 61/714,924, filed on Oct. 17, 2012.

(51) Int. Cl.
*H01L 21/683* (2006.01)

(52) U.S. Cl.
CPC ........ *H01L 21/6833* (2013.01); *H01L 21/6831* (2013.01)

(58) Field of Classification Search
USPC ........................................................ 361/234
See application file for complete search history.

(56) References Cited

U.S. PATENT DOCUMENTS

| | | | |
|---|---|---|---|
| 6,108,189 A * | 8/2000 | Weldon et al. ................ | 361/234 |
| 6,134,096 A | 10/2000 | Yamada et al. | |
| 7,736,462 B2 * | 6/2010 | Weichart .................. | 156/345.51 |
| 9,030,797 B2 * | 5/2015 | Wiltsche et al. ............. | 361/234 |
| 2006/0172536 A1 * | 8/2006 | Brown et al. ................. | 438/687 |
| 2006/0267294 A1 * | 11/2006 | Busse et al. ................... | 279/128 |
| 2008/0123241 A1 * | 5/2008 | Bollmann ..................... | 361/234 |
| 2009/0002913 A1 | 1/2009 | Naim | |
| 2010/0220425 A1 * | 9/2010 | Yonekura et al. ............ | 361/234 |
| 2011/0053301 A1 | 3/2011 | Kang et al. | |
| 2012/0028057 A1 | 2/2012 | Aihara et al. | |
| 2012/0091581 A1 * | 4/2012 | Hung ................. | H01L 23/5389 257/737 |
| 2012/0227886 A1 * | 9/2012 | Hsiao et al. .................... | 156/60 |

(Continued)

OTHER PUBLICATIONS

International Search Report and Written Opinion mailed Dec. 11, 2013 for PCT Application No. PCT/US2013/058228.

*Primary Examiner* — Thienvu Tran
*Assistant Examiner* — Angela Brooks
(74) *Attorney, Agent, or Firm* — Moser Taboada; Alan Taboada

(57) ABSTRACT

Embodiments of a portable electrostatic chuck for use in a substrate process chamber to support an ultra-thin substrate when disposed thereon are provided herein. In some embodiments, a portable electrostatic chuck may include a carrier comprising a dielectric material; an electrically conductive layer disposed on a top surface of the carrier; a dielectric layer disposed over the electrically conductive layer, such that the electrically conductive layer is disposed between the carrier and the dielectric layer; and at least one conductor coupled to the electrically conductive layer, wherein the portable electrostatic chuck is configured to electrostatically retain the ultra-thin substrate to the portable electrostatic chuck, wherein the portable electrostatic chuck is further configured to be handled and moved by substrate processing equipment outside of the substrate process chamber, and wherein the portable electrostatic chuck is sized to support large ultra-thin substrates.

20 Claims, 4 Drawing Sheets

(56) References Cited

U.S. PATENT DOCUMENTS

2012/0227889 A1* 9/2012 Schmitt et al. .................. 156/66
2013/0105087 A1* 5/2013 Cho et al. ................. 156/345.43
2013/0321973 A1* 12/2013 Wiltsche et al. ............... 361/234
2014/0071581 A1* 3/2014 Haas .................... H01L 21/6833
                                                              361/234
2015/0105087 A1* 4/2015 Horner et al. ................. 455/446

* cited by examiner

PORTABLE ELECTROSTATIC CHUCK CARRIER FOR THIN SUBSTRATES

CROSS-REFERENCE TO RELATED APPLICATIONS

This application claims benefit of U.S. provisional patent application Ser. No. 61/697,915, filed Sep. 7, 2012, and U.S. provisional patent application Ser. No. 61/714,924, filed Oct. 17, 2012, which are herein incorporated by reference.

FIELD

Embodiments of the present invention generally relate to a portable electrostatic chuck (e-chuck) for retaining a substrate for processing.

BACKGROUND

As the critical dimensions for electronic device displays continue to shrink in thickness, while increasing in overall size, there is an increased need for semiconductor process equipment that can adequately support and process large, extremely thin substrates disposed in a process chamber.

Typically, substrates were thick enough to be handled in large sheets and supported by pins or roller systems to be placed in a process chamber for processing (e.g., glass used in Thin Film Transistor Liquid Crystal Displays (TFT-LCDs)). An electrostatic chuck is typically physically located and fixed within a process chamber and generally supports and retains a substrate in a stationary position within the chamber. While the substrate is held by an electrostatic chuck (e-chuck), various processes are applied to the substrate to, for example, deposit or remove material from the surface of the substrate. However, large ultra-thin substrates (e.g., between about 10 to 200 microns thick, and about 500 mm square to about 3 meters square) are more like thin foils, for example, that cannot be handled in sheets the same way standard thickness glass (e.g., about 0.7 mm). Furthermore, current process chambers are not equipped to handle roll-to-roll processing of ultra-thin substrates.

In addition, the inventors have observed that handling large sheets of thin glass, required for next generation displays, is difficult since electrostatic chucks may not dechuck easily due to the dielectric nature of glass surface (i.e., no charge dissipation).

Thus, the inventor has provided methods and apparatus for supporting ultra-thin substrates in existing process chambers.

SUMMARY

Embodiments of a portable electrostatic chuck for use in a substrate process chamber to support an ultra-thin substrate when disposed thereon are provided herein. In some embodiments, a portable electrostatic chuck may include a carrier comprising a dielectric material; an electrically conductive layer disposed on a top surface of the carrier; a dielectric layer disposed over the electrically conductive layer, such that the electrically conductive layer is disposed between the carrier and the dielectric layer; and at least one conductor coupled to the electrically conductive layer, wherein the portable electrostatic chuck is configured to electrostatically retain the ultra-thin substrate to the portable electrostatic chuck, wherein the portable electrostatic chuck is further configured to be handled and moved by substrate processing equipment outside of the substrate process chamber, and wherein the portable electrostatic chuck is sized to support large ultra-thin substrates.

In some embodiments, a method for handling an ultra-thin substrate to be processed in one or more process chambers includes disposing the ultra-thin substrate on a portable electrostatic chuck disposed outside the one or more process chambers, the portable electrostatic chuck having at least one dielectric layer, an electrically conductive layer, and at least one electrode coupled to the electrically conductive layer, applying a first power to the electrode to provide a bias relative to the ultra-thin substrate which electrostatically retains the ultra-thin substrate to the portable electrostatic chuck, moving the portable electrostatic chuck and electrostatically retained ultra-thin substrate into a first process chamber through an opening in the first process chamber to perform a first set of one or more substrate processes, removing the portable electrostatic chuck and electrostatically retained ultra-thin substrate from the first process chamber through the opening in the first process chamber after the first set of substrate processes is performed, and applying a release power to the electrode to release the ultra-thin substrate from the portable electrostatic chuck.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
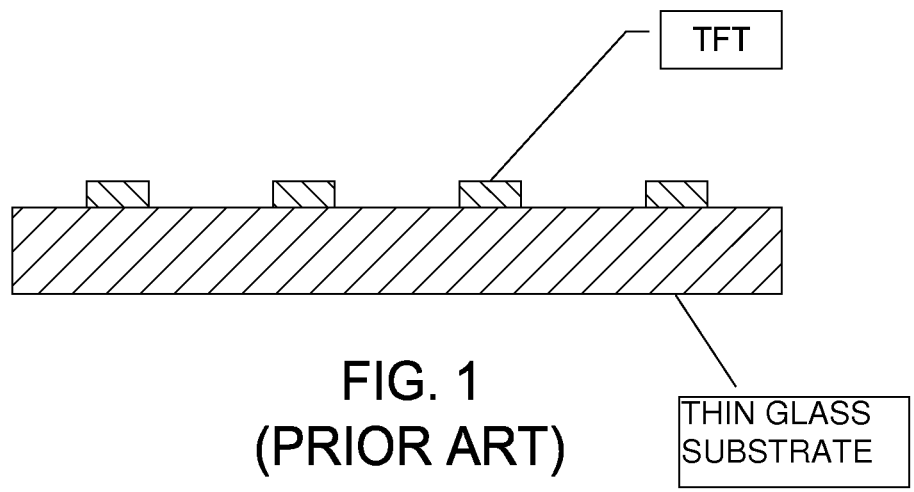
FIG. 1 depicts a vertical cross-section of a typical glass substrate of ordinary thickness.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods and apparatus for handling an ultra-thin substrate to be processed in one or more process chambers configured for handling thicker substrates. For example, embodiments consistent with the present invention enable the processing of ultra-thin substrates (e.g., between about 10 to 200 microns thick) without changing the existing sheet-to-sheet manufacturing processes in existing process chambers. In one exemplary application, embodiments of an electrostatic chuck present herein may facilitate the processing of, for example, thin film transistors (TFT) on thin glass substrates (e.g., about 100 micron) for liquid crystal displays (LCDs) without changing the existing sheet-to-sheet manufacturing process conventionally used for fabricating TFTs for LCD applications. In some embodiments, FIG. 1 depicts a vertical cross-section of a typical glass substrate used in LCD manufacturing. As shown, the typical glass substrate is about 0.7 mm. At this thickness, the glass substrate is rigid enough to be supported by support pins or rollers and may be handled and processed as sheets (i.e., sheets of the substrate may be placed conventionally on substrate supports, including fixed electrostatic chucks, which are fixed within a process chambers).

However, new ultra-thin substrates are more like thin foils, for example, that cannot be handled in sheets the same way standard thickness glass substrates are handled as discussed above. In order to enable processing of such ultra-thin substrates in conventional, sheet-based substrate processing systems, the inventor has provided a carrier for retaining an ultra-thin substrate thereon. The carrier has a form factor similar to conventional substrates such that the carrier and the substrate may be moved as one using existing equipment and infrastructure.

Figure 2:
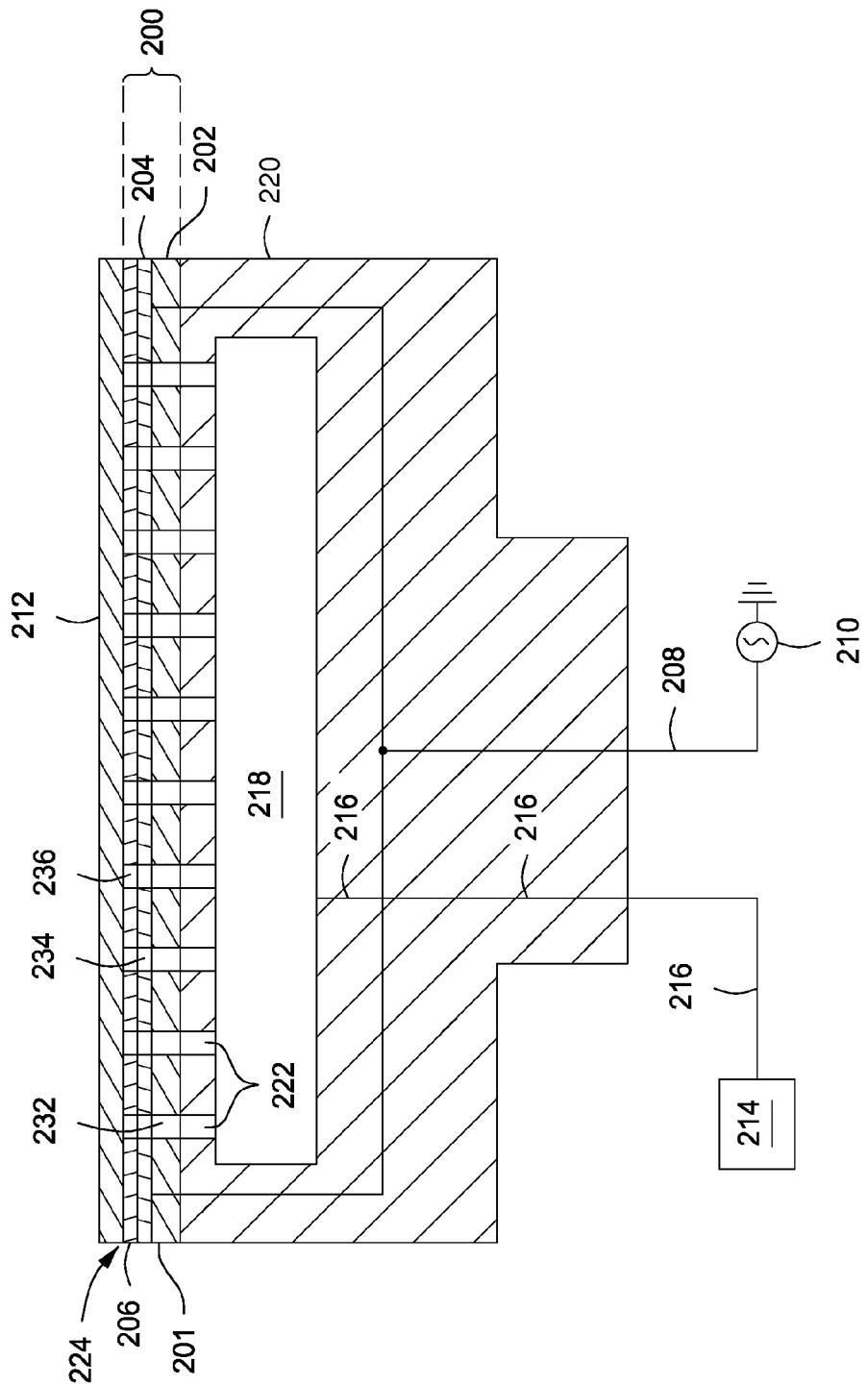
FIG. 2 depicts a vertical cross-section of a portable electrostatic chuck and pedestal support in accordance with some embodiments of the invention.

For example, FIG. 2 depicts a vertical cross-section of a portion of a portable electrostatic chuck 200 (e.g., a carrier for ultra-thin substrates) in accordance with some embodiments of the invention that is capable of handling ultra-thin substrates 212 for use in one or more process chambers to process ultra-thin substrates. The portable electrostatic chuck 200 may be moved into a load or unload station in a process chamber and supported by pedestal support 220. The portable electrostatic chuck 200 is configured to electrostatically retain an ultra-thin substrate 212. In some embodiments, a bias voltage may be applied to the portable electrostatic chuck 200 outside of a process chamber to electrostatically fix the ultra-thin substrate 212 to the portable electrostatic chuck 200. In some embodiments consistent with the present invention, continuous power does not need to be applied to the portable electrostatic chuck 200 in order to electrostatically fix the ultra-thin substrate 212 to the portable electrostatic chuck 200 (e.g., a bias voltage may be applied once or intermittently as needed.) Once the ultra-thin substrate 212 is electrostatically fixed to the portable electrostatic chuck 200 in a load station, the portable electrostatic chuck 200 may be moved into and out of different process chambers in order to process the substrate.

The thickness of the portable electrostatic chuck 200 is selected to provide sufficient stiffness to the ultra-thin substrate 212 disposed on the portable electrostatic chuck 200, such that the ultra-thin substrate 212 can be processed as a sheet in existing one or more process chambers without damaging the ultra-thin substrate 212. For example, in some embodiments, the portable electrostatic chuck 200 may be sized such that the portable electrostatic chuck 200 plus the ultra-thin substrate 212 (e.g., LCD glass) together have a thickness of about 0.7 mm (i.e., the same as typical LCD glass substrates currently processed) and may be handled in the same manner as typical LCD processing. Large ultra-thin flat panel substrates that may be processed may be on the order of 500 mm×500 mm to about 3 meters by 3 meters square, or larger in future generations. Thus, the portable electrostatic chuck is sized to support large ultra-thin flat panel substrate. That is, in some embodiments, the portable electrostatic chuck is substantially rectangular or square, and may be on the order of 500 mm square to about 3 meters square.

In some embodiments, the portable electrostatic chuck 200 may be used in a horizontal processing chamber such that the portable electrostatic chuck 200 supports the ultra-thin substrate 212 substantially parallel to the ground. In other embodiments, the portable electrostatic chuck 200 is used in a vertical processing chamber such that the portable electrostatic chuck 200 supports the ultra-thin substrate 212 substantially perpendicular to the ground. Since the portable electrostatic chuck 200 retains the ultra-thin substrate 212 thereon, the portable electrostatic chuck 200 may be held or moved in any orientation without damaging the ultra-thin substrate 212. In some embodiments, a conveyer system (e.g., robotic assembly, rollers, etc.) may be used to move the portable electrostatic chuck 200 into and out of openings in the various process chambers. Although directional terms such as top and bottom may be used herein for descriptive purposes of various features, such terms do not limit embodiments consistent with the present invention to a specific orientation.

The portable electrostatic chuck 200 includes a carrier 202 which may be fabricated of materials including, e.g., glass, aluminum oxide ($Al_2O_3$), aluminum nitride (AlN), silicon (Si), stainless steel, aluminum, ceramic, a nickel iron alloy having a low coefficient of thermal expansion (such as 64FeNi, for example, INVAR®) or the like. If the carrier material is a dielectric, a conductive layer 204 for the electrostatic chuck 200 (e.g., a chucking electrode) can be directly deposited on the carrier 202. In embodiments where the carrier material is not a dielectric, a dielectric layer may be disposed between carrier 202 and conductive layer 204. A layer of dielectric material (e.g., alumina ($Al_2O_3$), silicon oxide ($SiO_2$), silicon nitride (SiN), glass, ceramic or the like) is disposed over the conductive layer 204 to provide a support surface for the ultra-thin substrate 212. In some embodiments, the carrier 202 is fabricated of the same material as the ultra-thin substrate 212, or a material that has a substantially equivalent coefficient of thermal expansion as the material used for the ultra-thin substrate 212. This will advantageously prevent cracking and non-uniform thermal expansion/deformation between the carrier 202 and ultra-thin substrate 212 when heated during substrate processing. The thickness of carrier 202 is sized to provide sufficient stiffness to the portable electrostatic chuck 200 such that when the ultra-thin substrate 212 is disposed on the portable electrostatic chuck 200, the ultra-thin substrate 212 can be processed/handled as a sheet in existing process chambers. The thickness of the carrier 202 can be varied depending on the type of substrate being processed. In some embodiments, the thickness of carrier 202 and substrate 212 should match the thickness of conventional substrates processed for a specific type of substrate. For example, for LCD applications, the thickness of carrier 202 and substrate 212 should match the thickness of conventional LCD substrates (e.g., about 0.4-0.7 mm). By making the thickness of carrier 202 and substrate 212 match the thickness of conventional substrates processed for a specific type of substrate, the flexible, ultra-thin substrate 212 is advantageously able to be handled and processed in tools that are designed to handle rigid substrates.

The portable electrostatic chuck 200 includes an electrically conductive layer 204 disposed on a top surface of the carrier 202. The electrically conductive layer 204 may be fabricated of any electrically conductive material suitable for use in substrate processing, such as, e.g., aluminum (Al), copper (Cu), molybdenum (Mo), etc. In some embodiments, the electrically conductive layer 204 thickness is between about 100 nm and about 500 nm.

The electrically conductive layer 204 may be deposited and patterned to form a chucking electrode. The conductive layer 204 may be patterned to form a single electrode, or a plurality of electrodes. For example, in some embodiments the conductive layer 204 may be patterned to form a plurality of chucking electrodes positioned to retain a plurality of ultra-thin substrates 212 on a single carrier. For example, a plurality of ultra-thin substrates 212 may be held in an array on the portable electrostatic chuck 200 such that the plurality of ultra-thin substrates 212 may be simultaneously processed.

The portable electrostatic chuck 200 includes a dielectric layer 206 disposed over the electrically conductive layer 204, such that the electrically conductive layer 204 is disposed between the carrier 202 and the dielectric layer 206. The dielectric layer 206 may be fabricated of the same material as the ultra-thin substrate 212 and/or carrier 202, or a material that has a substantially equivalent coefficient of thermal expansion as the material used for the ultra-thin substrate 212 and/or carrier 202. The dielectric layer 206 supports the ultra-thin substrate 212 substantially parallel to a top surface of the portable electrostatic chuck 200 when the ultra-thin substrate 212 is disposed on the portable electrostatic chuck 200. In some embodiments, the dielectric layer 206 thickness is between about 100 nm and about 0.2 mm. The thickness of the dielectric layer may be varied depending on the electrostatic chucking force and resistivity desired. For example, the thicker the dielectric layer, the lower the electrostatic chucking force. The lower the resistivity, the longer the electrostatic chuck 200 will hold a substrate without recharging.

The portable electrostatic chuck 200 further includes at least one conductor 208 coupled to the electrically conductive layer 204. The at least one conductor 208 may be coupled to a power source 210. In some embodiments, when power from power source 210 is applied to the at least one conductor 208, a bias to the portable electrostatic chuck 200 relative to the ultra-thin substrate 212 is provided which electrostatically attracts the ultra-thin substrate 212 to the portable electrostatic chuck 200 sufficient to retain the ultra-thin substrate 212 thereon. In some embodiments, the number of conductors 208 is two. For example, in some embodiments, the portable electrostatic chuck 200 may be a bi-polar electrostatic chuck.

In some embodiments, the power source 210 is a portable battery power source coupled to the portable electrostatic chuck 200. The portable battery power source may be coupled to the at least one conductor 208 to provide a bias to the portable electrostatic chuck 200 relative to the ultra-thin substrate 212 which electrostatically retains the ultra-thin substrate 212 to the portable electrostatic chuck 200. The portable battery power source may move with the portable electrostatic chuck 200 as the portable electrostatic chuck 200 carries the ultra-thin substrate 212, for example, into and out of one or more process chambers. In other embodiments, the power source may be a fixed DC power source, such as a fixed battery, a DC power supply, a power charging station, or the like. In some embodiments, one or more power charging stations (not shown) may be located outside of the one or more processing chambers to provide a DC energy to the portable electrostatic chuck 200 to electrostatically retain the ultra-thin substrate 212 on the portable electrostatic chuck 200 during substrate processing within one or more process chambers without the need to continuously provide power to the portable electrostatic chuck 200 (i.e., if the discharge rate of the portable electrostatic chuck 200 is slow, a constant voltage to hold the charge is not required).

The portable electrostatic chuck 200 described above provides the chucking forces to retain the substrate onto carrier 202. However, the inventors have observed that de-chucking of ultra-thin substrates 212 (e.g., such as large sheets of thin glass) is difficult since electrostatic chucks may not dechuck easily due to the dielectric nature of glass surface which does not quickly or easily dissipate the electrostatic charges. To compensate for the electrostatic charges developed during chucking, elements of a vacuum chuck are incorporated into the portable electrostatic chuck 200 in some embodiments of the present invention. Specifically, the inventors have observed that by increasing a pressure in a gap 224 disposed between a top chucking surface 201 of the dielectric layer 206 and the ultra-thin substrate 212, the electrostatic chucking force is counteracted and the substrate will release/de-chuck. In some embodiments, the gap 224 is formed by the uneven contact surfaces of the chucking surface 201 and the ultra-thin substrate 212 when the ultra-thin substrate 212 is disposed on chucking surface 201. In other embodiments, the gap 224 may be formed by spacers or other features proximate the chucking surface that will support the ultra-thin substrate 212 in a fixed location to define the gap 224. In some embodiments, the gap 224 may be in micron range, up to several microns.

As shown in FIG. 2, in some embodiments, a gas reservoir 218 may be disposed in the body of the pedestal support 220. A gas may be provided to the gas reservoir 218 by gas source 214 via conduit 216. The gas contained in the gas reservoir 218 may diffuse through gas diffusion holes 222 disposed through the pedestal support 220. The carrier 202, electrically conductive layer 204, and dielectric layer 206 each have a corresponding set of gas diffusion holes 232, 234 and 236, respectively, that align with diffusion holes 222 when the portable electrostatic chuck 200 is disposed on pedestal support 220, in order to provide the gas to gap 224. That is, gas diffusion holes 232, 234 and 236 fluidly couple a bottom surface of the carrier 202 with a top surface of the dielectric layer 206, and therefore, fluidly couple diffusion holes 222 to the gap 224. In some embodiments, the diffusion holes 222 may be uniformly distributed across the chucking surface 201. When the pressure of the gas provided between the chucking surface 201 and the ultra-thin substrate 212 exceeds the electrostatic chucking force, the substrate 212 will release.

In some instances, local distortions, strains or even rupture may occur on the ultra-thin substrate 212 when a pressure is built under the ultra-thin substrate 212 for de-chucking purposes. To prevent this, in some embodiments, a source of charge may be provided to cover the entire backside of the ultra-thin substrate to assist in counteracting the electrostatic chucking force. Specifically, in some embodiments, a charged ionized gas (e.g., a plasma), may be provided to gas reservoir 218. In some embodiments, the gas will be partially pre-ionized using a filament or a small DC or RF plasma chamber disposed near the chuck. The plasma contains both ions and electrons. Thus if the chucking surface 201 is charged negatively, it will attract ions toward it to compensate for the charge. If the chucking surface 201 is charged positively, it will attract electrons toward it to compensate for the charge. Thus, providing additional charge from the plasma helps with reducing the chucking force by reducing the accumulated charge therefore reduces the pressure required beneath the thin substrate to dechuck the thin substrate, thereby reducing the likelihood of damage to the thin substrate.

In some embodiments, the diffusion holes 222, and holes 232, 234 and 236, are each about 30 microns to about 300 microns in diameter. In some embodiments, the number and diameter of the diffusion holes 222, and/or and holes 232, 234 and 236, determines the amount of gas/plasma that is provided to the gap 224. In some embodiments, the gap 224 may be grooves formed on the top chucking surface 201 of the dielectric layer 206 to distribute the gas between the ultra-thin substrate 212 and the top chucking surface 201 of the dielectric layer 206.

In some embodiments, alignment features may be provided to assist in aligning the diffusion holes 222 with holes 232, 234 and 236 when the carrier 200 is disposed on the pedestal support 220. For example, in some embodiments, alignment marks or tabs may be included on the carrier 200 and/or pedestal support 220. In some embodiments, alignment may be achieved by making the carrier 200 the same diameter as the support surface of the pedestal support 220.

In some embodiments, the plasma may be provided directly to gap 224. That is, when ultra-thin substrate 212 is disposed on the portable electrostatic chuck 200, a small gap is formed between the backside of substrate 212 and the chucking surface 201. A gas or plasma may be provided directly to gap 224 for de-chucking purposes.

Figure 3:
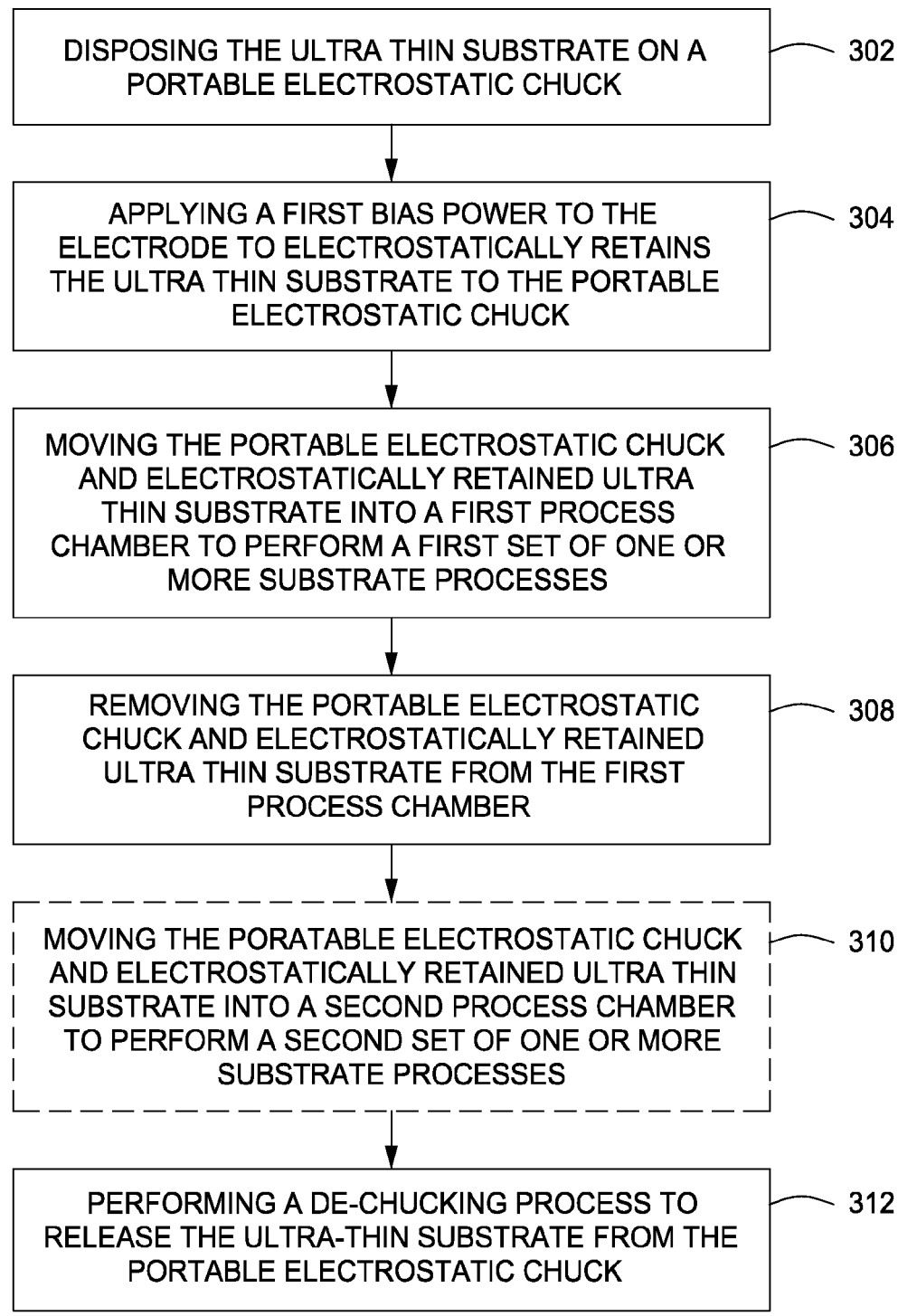
FIG. 3 depicts a method for handling an ultra-thin substrate to be processed in one or more process chambers.

In some embodiments, the at least one conductor 208 can also accept a reverse voltage or release power to de-chuck (i.e., release) the ultra-thin substrate 212 from the portable electrostatic chuck 200. In some embodiments, a reverse voltage (e.g., providing a voltage having the opposite polarity as the voltage provided to chuck the substrate) may be used to assist in de-chucking in combination with some of the de-chucking features discussed above, FIG. 3 depicts a method 300 for handling an ultra-thin substrate to be processed in one or more process chambers. The method 300 begins at 302, where an ultra-thin substrate is disposed the on a portable electrostatic chuck. The ultra-thin substrate may be disposed on a portable electrostatic chuck outside the one or more process chambers. As described above with respect to FIG. 2, the portable electrostatic chuck may include one or more dielectric layers, an electrically conductive layer, and at least one electrode coupled to the electrically conductive layer.

Next, at 304, a first power is applied to the electrode to provide a bias to the portable electrostatic chuck relative to the ultra-thin substrate which electrostatically retains the ultra-thin substrate to the portable electrostatic chuck. In some embodiments, the first power is applied to the portable electrostatic chuck at an initial power charging station. In other embodiments, the first power may be applied to the portable electrostatic chuck via a battery, which may be portable and may move with the portable electrostatic chuck.

At 306, the portable electrostatic chuck and electrostatically retained ultra-thin substrate is moved into a first process chamber through an opening in the first process chamber to perform a first set of one or more substrate processes. In some embodiments, the set of one or more substrate processes may include the formation of thin film transistors on ultra-thin glass substrates (e.g., between about 20 to about 100 microns thick). For example, in some embodiments, TFTs may be formed on the ultra-thin glass substrate for use in LCD applications. In other embodiments, the set of one or more substrate processes may include processing silicon ultra-thin substrates (e.g., between about 20 to about 100 microns thick). For example, in some embodiments, a plurality of rectangular (or other form factor) silicon substrates may be retained on a single portable electrostatic chuck to grow crystalline silicon (c-Si) layers for use in the fabrication of photovoltaic (PV) devices. PV devices formed on silicon (as compared to glass substrates) have fueled the rapid expansion and dramatic cost reductions in solar electric power. The present invention enables handling of a plurality of silicon substrates for fabrication of PV devices which can further lead to the reduction in cost of production of PV devices.

Next, at 308, the portable electrostatic chuck and electrostatically retained ultra-thin substrate is removed from the first process chamber through the opening in the first process chamber after the first set of substrate processes is performed.

In some embodiments, the portable electrostatic chuck and electrostatically retained ultra-thin substrate may optionally be moved, at 310, into a second process chamber through an opening in the second process chamber to perform a second set of one or more substrate processes. In some embodiments, for example where the chucking electrodes are not continuously provided with DC power, a second power may optionally be applied to ensure that the ultra-thin substrate is electrostatically retained to the portable electrostatic chuck prior to moving the portable electrostatic chuck and electrostatically retained ultra-thin substrate into the second process chamber. In some embodiments, the second power may be applied to the portable electrostatic chuck at an intermediate power charging station.

Finally, at 312, a release power is applied to the electrode to release the ultra-thin substrate from the portable electrostatic chuck.

Thus, embodiments of methods and apparatus for handling ultra-thin substrates to be processed in one or more process chambers configured for handling thicker substrates have been provided. In some embodiments where a thin glass substrate is to be processed, the e-chuck carrier could be made out of glass or a material with a similar coefficient of thermal expansion. A structured thin metal layer (e.g., a patterned aluminum layer) may be covered with a dielectric (e.g., Al2O3 or AlN) to form an e-chuck carrier. Before processing the thin glass in an LCD fab, the substrate would be put on top of the e-chuck carrier glass and a voltage would be applied. This connects the e-chuck carrier glass and thin glass. After the processing is done, the reverse voltage would be applied (de-chucking) and the thin glass could be used as e.g. a backplane in an LCD TV.

Figure 4:
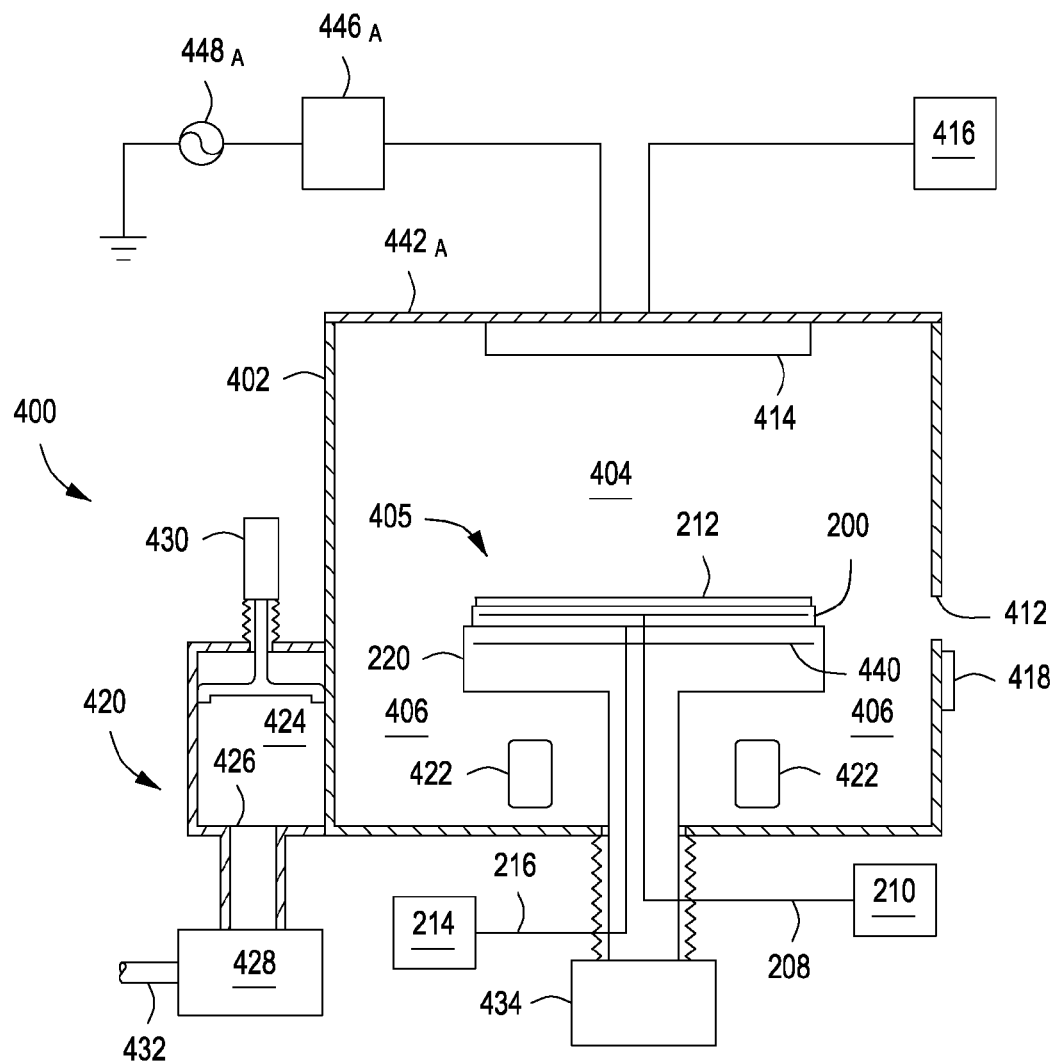
FIG. 4 depicts an apparatus for loading and unloading substrates in accordance with some embodiments of the present invention.

FIG. 4 depicts a schematic, cross-sectional view of an exemplary substrate processing chamber in accordance with some embodiments of the present invention. The process chamber may be any type of chamber suitable to facilitate the fabrication of microelectronic devices, including but not limited to TFT-LCD devices, crystalline-silicon (c-Si) epitaxial deposition for PV devices, or the like. The process chamber may be any type of chamber suitable for substrates of a desired size, for example, such as flat panel substrates on the order of 500 mm square to about 3 meters square. In addition, the process chamber may be any type of chamber suitable for substrates of a desired shape, such as, for example, circular wafers (e.g., 200 mm, 300 mm, 450 mm, or the like semiconductor substrates), rectangular or square flat panels (e.g., for display, solar, light emitting diode (LED), and other similar applications), or the like. Examples of suitable chambers include, but are not limited to, the AKT PECVD for horizontal processing, and the AKT Alzenau PiVoT or New Aristo chambers for vertical processing, each of which is commercially available from Applied Materials, Inc., of Santa Clara, Calif. Other process chambers from Applied Materials, Inc. or other manufacturers may also benefit from the inventive apparatus disclosed herein. Although described below in terms of certain configurations and support equipment, the below description is purely illustrative and the portable electrostatic chuck may be used in connection with process chambers having different configurations.

The process chamber 402 has an inner volume 405 that may include a processing volume 404 and an exhaust volume 406. The processing volume 404 may be defined, for example, between a pedestal support 220 disposed within the process chamber 402 and one or more gas inlets, such as a showerhead 414 and/or nozzles provided at desired locations. The pedestal support 220 supports the portable electrostatic chuck 200 (described above with respect to FIG. 2). The portable electrostatic chuck 200 is used to support a substrate 212 (e.g., an ultra-thin substrate) thereupon during processing.

The portable electrostatic chuck 200 may be transferred to the pedestal support 220 via conventional handling mechanisms, such as transfer robots, lift pins in the pedestal support 220, or the like. The pedestal support 220 may include an electrode 440, or other mechanism for assisting in retaining the portable electrostatic chuck 200 in place during processing. In some embodiments, the electrode 440 may be coupled to a power source 210. Power source 210 may provide power to electrode 440 and/or conductor 208 for retaining substrate 212 in place. In some embodiments, gas supply 214 may provide a de-chucking gas to portable electrostatic chuck 200 via conduit 216. In some embodiments, the pedestal support 220, or the portable electrostatic chuck 200, may include mechanisms for controlling the substrate temperature.

The portable electrostatic chuck 200, and substrate 212 which may be electrostatically retained on portable electrostatic chuck 200, may enter the process chamber 402 via an opening 412 in a wall of the process chamber 402. The opening 412 may be selectively sealed via a slit valve 418, or other mechanism for selectively providing access to the interior of the chamber through the opening 412. The pedestal support 220 may be coupled to a lift mechanism 434 that may control the position of the pedestal support 220 between a lower position (as shown) suitable for transferring the portable electrostatic chuck 200 and substrates into and out of the chamber via the opening 412 and a selectable upper position suitable for processing. The process position may be selected to maximize process uniformity for a particular process step. When in at least one of the elevated processing positions, the pedestal support 220 may be disposed above the opening 412 to provide a symmetrical processing region.

The one or more gas inlets (e.g., the showerhead 414) may be coupled to a gas supply 416 for providing one or more process gases into the processing volume 404 of the process chamber 402. Although a showerhead 414 is shown in FIG. 4, additional or alternative gas inlets may be provided, such as nozzles or inlets disposed in the ceiling 442 or on the sidewalls of the process chamber 402 or at other locations suitable for providing gases as desired to the process chamber 402, such as the base of the process chamber, the periphery of the substrate support, or the like.

One or more plasma power sources (one RF power source 448 shown) may be coupled to the process chamber 402 to supply RF power source to the target 414 via one or more respective match networks (one match network 446 shown). In some embodiments, the apparatus 400 may utilize inductively coupled RF power source for processing. For example, the process chamber 402 may have a ceiling 442 made from a dielectric material and a dielectric showerhead 414. The ceiling 442 may be substantially flat, although other types of ceilings, such as dome-shaped ceilings or the like, may also be utilized. The one or more plasma sources may be capable of producing up to 5000 W at a frequency of about 2 MHz and/or about 13.56 MHz, or higher frequency, such as 27 MHz and/or 60 MHz.

The exhaust volume 406 may be defined, for example, between the pedestal support 220 and a bottom of the process chamber 402. The exhaust volume 406 may be fluidly coupled to the exhaust system 420, or may be considered a part of the exhaust system 420. The exhaust system 420 generally includes a pumping plenum 424 and one or more conduits that couple the pumping plenum 424 to the inner volume 405 (and generally, the exhaust volume 406) of the process chamber 402.

Each conduit has an inlet 422 coupled to the inner volume 405 (or, in some embodiments, the exhaust volume 406) and an outlet (not shown) fluidly coupled to the pumping plenum 424. For example, each conduit may have an inlet 422 disposed in a lower region of a sidewall or a floor of the process chamber 402. In some embodiments, the inlets are substantially equidistantly spaced from each other.

A vacuum pump 428 may be coupled to the pumping plenum 424 via a pumping port 426 for pumping out the exhaust gases from the process chamber 402. The vacuum pump 428 may be fluidly coupled to an exhaust outlet 432 for routing the exhaust as required to appropriate exhaust handling equipment. A valve 430 (such as a gate valve, or the like) may be disposed in the pumping plenum 424 to facilitate control of the flow rate of the exhaust gases in combination with the operation of the vacuum pump 428. Although a z-motion gate valve is shown, any suitable, process compatible valve for controlling the flow of the exhaust may be utilized.

While the foregoing is directed to embodiments of the present invention, other and further embodiments of the invention may be devised without departing from the basic scope thereof.

The invention claimed is:

1. A portable electrostatic chuck for use in a substrate process chamber to support an ultra-thin substrate when disposed thereon, comprising:
   a carrier comprising a dielectric material;
   an electrically conductive layer disposed on a top surface of the carrier;
   a dielectric layer disposed over the electrically conductive layer, such that the electrically conductive layer is disposed between the carrier and the dielectric layer; and
   at least one conductor coupled to the electrically conductive layer,
   wherein the portable electrostatic chuck is configured to electrostatically retain the ultra-thin substrate to the portable electrostatic chuck, wherein the portable electrostatic chuck is further configured to be handled and moved by substrate processing equipment outside of the substrate process chamber, and wherein the portable electrostatic chuck is sized to support large ultra-thin substrates.

2. The portable electrostatic chuck of claim 1, wherein the portable electrostatic chuck and the large ultra-thin substrates are rectangular.

3. The portable electrostatic chuck of claim 1, wherein the portable electrostatic chuck is about 500 mm square to about 3 meters square.

4. The portable electrostatic chuck of claim 1, wherein the carrier is configured to provide sufficient stiffness to the portable electrostatic chuck such that when the ultra-thin substrate is disposed on the portable electrostatic chuck, the ultra-thin substrate can be processed as a sheet in the one or more process chambers.

5. The portable electrostatic chuck of claim 1, wherein a thickness of the portable electrostatic chuck is between about 0.4 mm to about 0.7 mm.

6. The portable electrostatic chuck of claim 5, wherein a thickness of the carrier is less than 0.7 mm by about 10 to 200 microns.

7. The portable electrostatic chuck of claim 1, wherein the carrier is fabricated from at least one of glass, aluminum oxide ($Al_2O_3$), aluminum nitride (AlN), silicon (Si), stainless steel, aluminum, ceramic, or nickel iron alloys having a low coefficient of thermal expansion.

8. The portable electrostatic chuck of claim 1, wherein the carrier comprises a material that has a substantially equivalent coefficient of thermal expansion as the ultra-thin substrate to be processed.

9. The portable electrostatic chuck of claim 1, wherein each of the carrier, the electrically conductive layer, and the dielectric layer include gas diffusion holes formed therethrough that fluidly couple a bottom surface of the carrier with a top surface of the dielectric layer.

10. The portable electrostatic chuck of claim 9, wherein the gas diffusion holes of each of the carrier, the electrically conductive layer, and the dielectric layer are between 30 microns and 300 microns in diameter.

11. The portable electrostatic chuck of claim 1, further comprising a portable battery power source coupled to the at least one conductor to provide a bias to the portable electrostatic chuck relative to the ultra-thin substrate which electrostatically retains the ultra-thin substrate to the portable electrostatic chuck.

12. The portable electrostatic chuck of claim 1, wherein the at least one conductor is configured to be coupled to one or more power charging stations located outside the one or more processing chambers to provide a bias to the portable electrostatic chuck relative to the ultra-thin substrate which electrostatically retains the ultra-thin substrate to the portable electrostatic chuck during substrate processing within the one or more process chambers.

13. A method for handling an ultra-thin substrate to be processed in one or more process chambers, the method comprising:
- disposing the ultra-thin substrate on a portable electrostatic chuck disposed outside the one or more process chambers, the portable electrostatic chuck comprising:
  - a carrier comprising a dielectric material;
  - an electrically conductive layer disposed on a top surface of the carrier;
  - a dielectric layer disposed over the electrically conductive layer, such that the electrically conductive layer is disposed between the carrier and the dielectric layer; and
  - at least one electrode coupled to the electrically conductive layer, wherein the portable electrostatic chuck is sized to support large ultra-thin substrates;
- applying a first power to the electrode to provide a bias to the portable electrostatic chuck relative to the ultra-thin substrate which electrostatically retains the ultra-thin substrate to the portable electrostatic chuck;
- moving the portable electrostatic chuck and electrostatically retained ultra-thin substrate into a first process chamber through an opening in the first process chamber to perform a first set of one or more substrate processes;
- removing the portable electrostatic chuck and electrostatically retained ultra-thin substrate from the first process chamber through the opening in the first process chamber after the first set of substrate processes is performed; and
- performing a de-chucking process to release the ultra-thin substrate from the portable electrostatic chuck.

14. The method of claim 13, wherein the portable electrostatic chuck is about 500 mm square to about 3 meters square.

15. The method of claim 13, wherein the method further includes:
- applying a second power to ensure that the ultra-thin substrate is electrostatically retained to the portable electrostatic chuck; and
- moving the portable electrostatic chuck and electrostatically retained ultra-thin substrate into a second process chamber.

16. The method of claim 15, wherein the first power is applied to the portable electrostatic chuck at an initial power charging station, and wherein the second power is applied to the portable electrostatic chuck at an intermediate power charging station.

17. The method of claim 13, wherein the ultra-thin substrate is glass substrate with a thickness of between about 10 to 200 microns.

18. The method of claim 13, wherein the de-chucking process includes:
- providing a gas between the portable electrostatic chuck and the ultra-thin substrate to release the ultra-thin substrate from the portable electrostatic chuck.

19. The method of claim 18, wherein the gas is a charged ionized plasma, and wherein the charged ionized plasma reduces a chucking force by reducing an accumulated charge on the ultra-thin substrate.

20. An apparatus for unloading an ultra-thin substrate comprising:
- a portable electrostatic chuck comprising:
  - a carrier comprised of a dielectric material;
  - an electrically conductive layer disposed on a top surface of the carrier;
  - a dielectric layer having a support surface, wherein the dielectric layer is disposed over the electrically conductive layer, such that the electrically conductive layer is disposed between the carrier and the dielectric layer; and
  - a plurality of gas diffusion holes formed through the carrier, the electrically conductive layer, and the dielectric layer that fluidly couple a bottom surface of the carrier to the support surface of the dielectric layer; and
- a pedestal support having a support surface that supports the portable electrostatic chuck when disposed thereon, the substrate comprising:
  - a body;
  - a gas reservoir disposed in the body; and
  - a plurality of gas diffusion holes that fluidly couple the gas reservoir to the support surface, wherein the plurality of gas diffusion holes of the support surface align with the plurality of gas diffusion holes of the portable electrostatic chuck.

* * * * *